United States Patent
Knights et al.

(10) Patent No.: US 9,831,360 B2
(45) Date of Patent: Nov. 28, 2017

(54) INTEGRATED THERMAL STABILIZATION OF A MICRORING RESONATOR

(71) Applicants: MCMASTER UNIVERSITY, Hamilton (CA); THE TRUSTEES OF COLUMBIA UNIVERSITY IN THE CITY OF NEW YORK, New York, NY (US)

(72) Inventors: Andrew Knights, Dundas (CA); Dylan Logan, Ottawa (CA); Kishore Padmaraju, New York, NY (US); Keren Bergman, Princeton, NJ (US)

(73) Assignees: McMaster University, Hamilton, ON (CA); The Trustees of Columbia University in the City of New York, New York, NY (US)

( * ) Notice: Subject to any disclaimer, the term of this patent is extended or adjusted under 35 U.S.C. 154(b) by 156 days.

(21) Appl. No.: 14/434,081

(22) PCT Filed: Oct. 9, 2013

(86) PCT No.: PCT/CA2013/050761
§ 371 (c)(1),
(2) Date: Apr. 7, 2015

(87) PCT Pub. No.: WO2014/056105
PCT Pub. Date: Apr. 17, 2014

(65) Prior Publication Data
US 2015/0263190 A1    Sep. 17, 2015

Related U.S. Application Data

(60) Provisional application No. 61/711,396, filed on Oct. 9, 2012.

(51) Int. Cl.
*H01L 31/02* (2006.01)
*H01L 31/0232* (2014.01)
(Continued)

(52) U.S. Cl.
CPC ........ *H01L 31/02327* (2013.01); *G02F 1/011* (2013.01); *G02F 1/0123* (2013.01);
(Continued)

(58) Field of Classification Search
CPC ...... G02F 1/011; G02F 1/0123; G02F 1/0147; G02F 2202/105; G02F 2203/15; G02F 31/02327; G02F 31/024
See application file for complete search history.

(56) References Cited

U.S. PATENT DOCUMENTS 6,389,203 B1    5/2002   Jordan et al.
6,766,083 B2    7/2004   Bona et al.
(Continued)

FOREIGN PATENT DOCUMENTS

WO    2012099606    7/2012

OTHER PUBLICATIONS

A. V. Krishnamoorthy et al., "Computer systems based on silicon photonic interconnects," Proc. IEEE 97(7), 1337-1361 (2009).
(Continued)

*Primary Examiner* — Francis M Legasse, Jr.
(74) *Attorney, Agent, or Firm* — Lynn C. Schumacher; Stephen W. Leonard; Hill & Schumacher

(57) ABSTRACT

Embodiments of the present disclosure provide devices and methods involving the thermal stabilization of microring resonators, such as microring modulators. Power is measured via an on-chip photodetector integrated with a drop port of the microring resonator, providing a local measurement of average power. This average power is employed as a feedback measure to actively control a heater that is integrated with the microring resonator, in order to stabilize the resonant wavelength of the microring resonator in the presence of thermal fluctuations. Employing such a system, a microring modulator can maintain error-free performance
(Continued)

under thermal fluctuations that would normally render it inoperable.

29 Claims, 11 Drawing Sheets

(51) Int. Cl.
    *G02F 1/01*         (2006.01)
    *H01L 31/024*     (2014.01)

(52) U.S. Cl.
    CPC .......... *G02F 1/0147* (2013.01); *H01L 31/024* (2013.01); *G02F 2202/105* (2013.01); *G02F 2203/15* (2013.01)

(56) References Cited

U.S. PATENT DOCUMENTS

| | | | |
|---|---|---|---|
| 7,058,258 B2 | 6/2006 | Yamazaki | |
| 7,616,850 B1 | 11/2009 | Watts et al. | |
| 7,684,666 B2 | 3/2010 | Hamann et al. | |
| 2010/0200733 A1* | 8/2010 | McLaren | G02B 6/12007 250/214 C |
| 2012/0062974 A1 | 3/2012 | Manipatruni et al. | |
| 2012/0081197 A1 | 4/2012 | Park et al. | |
| 2013/0037692 A1 | 2/2013 | Akiyama | |

OTHER PUBLICATIONS

N. Ophir et al., "Silicon photonic microring links for high-bandwidth-density, low-power chip I/O," IEEE Micro 33(1), 54-67 (2013).
W. A. Zortman et al., "Bit error rate monitoring for active wavelength control of silicon microphotonic resonant modulators," IEEE Micro 33(1), 42-52 (2013).
K. Padmaraju et al., "Thermal stabilization of a microring modulator using feedback control," Opt. Express 20(27), 27999-28008 (2012).
M. W. Geis et al., "Silicon waveguide infrared photodiodes with >35 GHz bandwidth and phototransistors with 50 AW-1 response," Opt. Express 17(7), 5193-5204 (2009).
R. R. Grote et al., "10 Gb/s error-free operation of all-silicon ion-implanted-waveguide photodiodes at 1.55 μm," IEEE Photon. Technol. Lett. 25(1), 67-70 (2013).
D. F. Logan et al., "Monitoring and tuning micro-ring properties using defect-enhanced silicon photodiodes at 1550 nm," IEEE Photon. Technol. Lett. 24(4), 261-263 (2012).
K. Padmaraju et al., "Integrated thermal stabilization of a microring modulator," Proc. Optical Fiber Communication Conference (Optical Society of America, 2013), paper OM2H.7.
J. Teng et al., "Athermal silicon-on-insulator ring resonators by overlaying a polymer cladding on narrowed waveguides," Opt. Express 17(17), 14627-14633 (2009).
W. A. Zortman et al., "Integrated CMOS compatible low power 10Gbps silicon photonic heater-modulator," Proc. Optical Fiber Communication Conference (Optical Society of America, 2012), paper OW4I.5.
V. Michal et al., "Single active element PID controllers," Radioelektronika, 2010 20th International Conference.
Y.-H. Chen et al., "Scalable electrical-optical thermal simulator for multicores with optical interconnects," Proc. IEEE Optical Interconnects Conference (IEEE, 2013), paper MA3.
C. J. B. Fayomi et al., "Reliable circuit techniques for low-voltage analog design in deep submicron standard CMOS: a tutorial," Analog Integr. Circuits Signal Process. 39(1), 21-38 (2004).
D. Brunina et al., "10-Gb/s WDM optically-connected memory system using silicon microring modulators," Proc. European Conference on Optical Communications (Optical Society of America, 2012), paper Mo.2.A.5.
D. Livshits et al., "Cost-effective WDM optical interconnects enabled by quantum dot comb lasers," Proc. Optoelectronic Interconnects and Component Integration IX (SPIE, 2010).
A. V. Krishnamoorthy et al., "Exploiting CMOS manufacturing to reduce tuning requirements for resonant optical devices," IEEE Photon. J. 3(3), 567-579 (2011).
M. Georgas et al., "Addressing link-level design tradeoffs for integrated photonic interconnects," in Custom Integrated Circuits Conference (IEEE, 2011), 978-1-4577-0233-5/11.
P. Dong et al., "Thermally tunable silicon racetrack resonators with ultralow tuning power," Opt. Express 18(19), 20298-20304 (2010).
Manipatruni, S. et al., Wide temperature range operation of micrometerscale silicon electro-optic modulators, Opt. Lett. 33, 2185-2187 (2008).
Padmaraju, K. et al., Dynamic Stabilization of a Microring Modulator Under Thermal Perturbation, OFC/NFOEC Technical Digest (2012).
Knights et al., Defect mediated detection of wavelengths around 1550 nm in a ring resonant structure, Proceedings of SPIE vol. 7943, pp. 794308-1 to 794308-7, Jan. 31, 2011, DOI:10.1117/11.874018.
Liu et al., 10-Gbps, 5.3-mW Optical transmitter and receiver circuits in 40-nm CMOS, HEEE Journal of Solid State Circuits, vol. 47, No. 9, pp. 2049-2067, Sep. 2012, DOI:10.1109/JSSC.2012.2197234.
Doylend et al., Silicon photonic dynamic optical channel leveller with external feedback loop, Optics Express, vol. 18, No. 13, pp. 13805 to 13812, Jun. 7, 2010.
Dong et al., Wavelength-tunable silicon microring resonators, Optics Express, vol. 18, No. 11, pp. 10941 to 10946, May 24, 2010.
Qui et al., Wavelength tracking with thermally controlled silicon resonators, Optics Express, vol. 19, No. 6, pp. 5143 to 5148, Mar. 14, 2011.
Kimerling et al., Electronic-photonic integrated circuits on the CMOS platform, Proceedings of SPIE, vol. 6125, pp. 612502-1 to 612502-10, Feb. 10, 2006, DOI:10.1117/12.654455.
Lentine et al., Active wavelength control of silicon microphotonic resonant modulators, IEEE Conference Proceedings, Optical Interconnects Conf., 2012, TuC5, pp. 46 and 47, May 20-23, 2012, DOI:10.1109/OIC.2012.6224454.
International Search Report in PCT/CA2013/050761 dated Apr. 3, 2014.
Written Opinion in PCT/CA2013/050761 dated Apr. 3, 2014.

* cited by examiner

| | Demonstrated | Leading Technology |
|---|---|---|
| Integrated Heater | Tuning efficiency of 0.12 nm/mW | Tuning efficiency of 1.14 nm/mW [W. A Zortman, OFC, 2012] |
| Circuitry | Laboratory op-amps (~mW) | CMOS VLSI op-amps (40 μW) [C. J. B. Fayomi, Analog Integrated Circuits Signal Processing, 2004] |

INTEGRATED THERMAL STABILIZATION OF A MICRORING RESONATOR

CROSS-REFERENCE TO RELATED APPLICATION

This application is a National Phase application claiming the benefit of the international PCT Patent Application No. PCT/CA2013/050761, filed on Oct. 9, 2013, in English, which claims priority to U.S. Provisional Application No. 61/711,396, titled "INTEGRATED THERMAL STABILIZATION OF A MICRORING MODULATOR" and filed on Oct. 9, 2012, the entire contents of which are incorporated herein by reference.

BACKGROUND

The following disclosure relates to optical devices for integrated optical circuits. More particularly, the present disclosure relates the devices and methods for thermally stabilizing integrated optical devices.

Growing bandwidth demand has made necessary the use of optical communications at unprecedented small scales and distances, in scenarios such as rack-to-rack links in data centers, board-to-board interconnects, and ultimately for use within multi-core processors [1]. However, at these reduced scales, optical links are only feasible if they can be realized in a small footprint and energy-efficient manner. For this reason, the silicon photonics platform, with its ability to manifest CMOS-compatible photonic devices, is promising for use in next-generation optical links. In particular, microring-based silicon photonic devices have been shown to push the boundaries on the aforementioned metrics of size and energy efficiency [2].

However, as the high-performance functionality of both passive and active microring-based devices have continued to be demonstrated, concerns have grown over the suitability of these devices for use in thermally volatile environments. The high thermo-optic coefficient of silicon, combined with the resonant nature of the microring-based devices, makes the operation of said devices susceptible to thermal fluctuations of only a few kelvin (K) [3]. Additionally, due to fabrication variation, the initial wavelength position of the microring resonance needs to be adjusted to match the operating wavelength of the optical path. It has been shown that using a control system, based on varying the bias current applied to the modulator in response to changes in power (measured off-chip), a microring modulator could maintain error-free performance under thermal fluctuations that would normally render it inoperable [4].

SUMMARY

Embodiments of the present disclosure provide devices and methods involving the thermal stabilization of microring resonators, such as microring modulators. Power is measured via an on-chip photodetector integrated with a drop port of the microring resonator, providing a local measurement of average power. This average power is employed as a feedback measure to actively control a heater that is integrated with the microring resonator, in order to stabilize the resonant wavelength of the microring resonator in the presence of thermal fluctuations. Employing such a system, a microring modulator can maintain error-free performance under thermal fluctuations that would normally render it inoperable.

Accordingly, in one aspect, there is provided a thermally stabilized integrated optical device comprising:
 a microring resonator;
 a photodetector integrated with said microring resonator;
 a heater configured to locally heat said microring resonator; and
 a controller interfaced with said photodetector and said heater, wherein said controller is configured to thermally stabilize a resonant wavelength of said microring resonator by controlling said heater to maintain the average power measured by said photodetector.

In another aspect, there is provided a method of stabilizing the operation of an integrated optical device, the integrated optical device comprising a microring resonator having a heater and a photodetector interfaced directly therewith, the method comprising:
 measuring average power from the photodetector; and
 controlling the heater to maintain the average power.

A further understanding of the functional and advantageous aspects of the disclosure can be realized by reference to the following detailed description and drawings.

BRIEF DESCRIPTION OF THE DRAWINGS

Embodiments will now be described, by way of example only, with reference to the drawings, in which.

DETAILED DESCRIPTION

Various embodiments and aspects of the disclosure will be described with reference to details discussed below. The following description and drawings are illustrative of the disclosure and are not to be construed as limiting the disclosure. Numerous specific details are described to provide a thorough understanding of various embodiments of the present disclosure. However, in certain instances, well-known or conventional details are not described in order to provide a concise discussion of embodiments of the present disclosure.

As used herein, the terms "comprises" and "comprising" are to be construed as being inclusive and open ended, and not exclusive. Specifically, when used in the specification and claims, the terms "comprises" and "comprising" and variations thereof mean the specified features, steps or components are included. These terms are not to be interpreted to exclude the presence of other features, steps or components.

As used herein, the term "exemplary" means "serving as an example, instance, or illustration," and should not be construed as preferred or advantageous over other configurations disclosed herein.

As used herein, the terms "about" and "approximately" are meant to cover variations that may exist in the upper and lower limits of the ranges of values, such as variations in properties, parameters, and dimensions. In one non-limiting example, the terms "about" and "approximately" mean plus or minus 10 percent or less.

Unless defined otherwise, all technical and scientific terms used herein are intended to have the same meaning as commonly understood to one of ordinary skill in the art.

As used herein, the term "microring resonator" refers to any and all optical resonators in which the resonant optical mode propagates in a ring or annulus within the resonator. In some embodiments, a "microring resonator" may be an annular, waveguide-based resonator. In other embodiments, a "microring resonator" may be a micro-disk resonator. Micro-disk resonators are functionally equivalent to microring resonators, in that the resonant optical mode of a micro-disk resonator propagates in an annular geometry within the micro-disk.

Embodiments of the present disclosure provide devices and methods in which microring resonators are thermally stabilized, via an integrated heater, based on average optical power measured from an integrated photodiode connected to an optical drop of the microring resonator. Unlike other devices and methods of thermal stabilization that are known to those skilled in the art, the devices and methods described herein utilize a local measure of average optical power, provided by the on-chip photodiode integrated with a drop port of the microring resonator, as a feedback measure. As described in detail below, microring devices and methods involving local average power measurement to control local heating are suitable and adaptable to a wide variety of microring-based devices and applications.

Figure 1A:
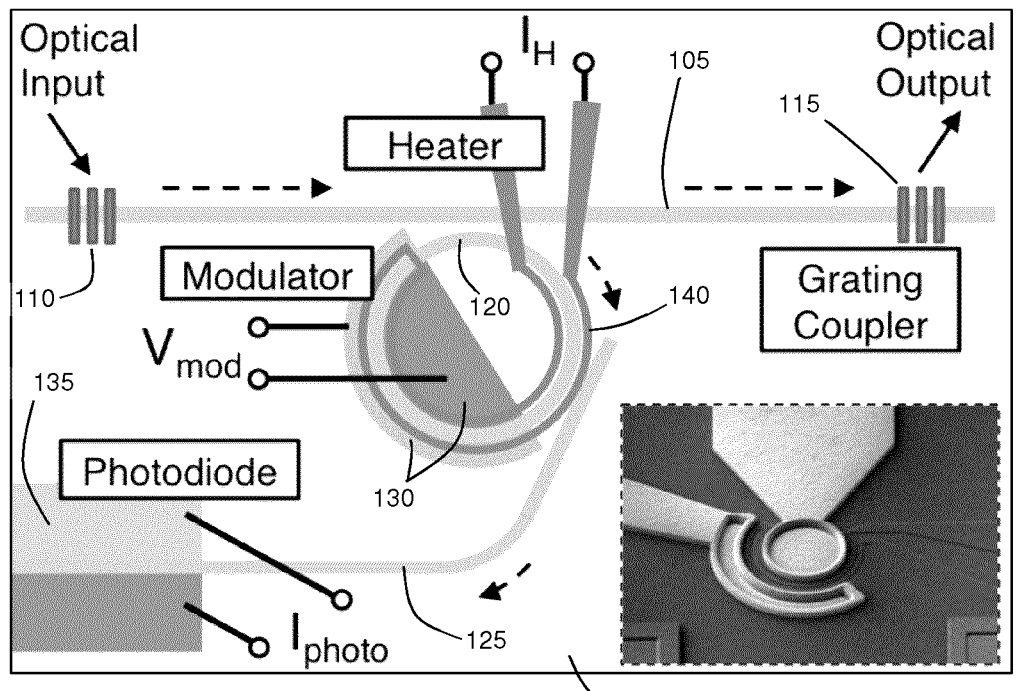
FIG. 1A shows an overhead schematic of an example integrated microring modulator device (not to scale) and waveguide geometry. Included in the schematic are the on-chip components.

An example implementation of a thermally-stabilized microring resonator is provided in FIG. 1A, which shows the on-chip components of a microring modulator that includes on-chip components for thermal stabilization. The example device includes planar substrate 100, bus waveguide 105, with input grating coupler 110 and output grating coupler 115, microring modulator 120, drop port waveguide 125, modulator regions 130 (described in more detail in FIGS. 1B and 1C), integrated photodiode 135, and integrated heater 140. To keep the microring modulator thermally stabilized, integrated photodiode 140 on drop port 125 is employed to ascertain changes in the temperature of the microring modulator, via the detection in changes in the mean power of the modulated-signal. The inset of FIG. 1A shows a scanning electron microscope image of a microring resonator.

Unlike known thermally stabilized microring resonator devices, the configuration shown in FIG. 1A, utilizing power recycled from drop port 125, avoids the use of a power tap, thereby reducing loss, and avoiding out-of-channel loss for signals that are not resonant with the ring resonator. For example, it is known that the use of an optical tap can result in high coupling losses, for example, broadband losses of 10%. In the present embodiments that employ an integrated photodetector connected to the drop port, the losses can be reduced.

The use of an integrated heaters enable power-efficient temperature tuning over a much larger range than the DC biasing mechanism known in the art, which alters the high-speed electrical signal driving the microring modulator and results in a degradation of the generated optical signal. Accordingly, the embodiments of the present disclosure may be beneficial as they prevent interference to the sensitive high-speed modulation signal, thereby providing a bit-rate transparent solution that operates independently without altering high-speed performance of the microring resonator.

In some embodiments, as described below, the device design provides for efficient thermal performance, and can be implemented with leading technology to provide power-efficient (projected 50-250 fJ/bit at 10 Gb/s) stabilization. Furthermore, the integrated heater can allow wide range of tuning (for example, up to and greater than >50 K, in some embodiments). Also, as described below, the thermally stabilized device shown in FIG. 1A is compatible with the WDM arrangement of microring modulators, where several microrings are cascaded along the same waveguide bus.

In some embodiments, the device (or variations thereof described below) may be fabricated according to a silicon-based process, for example, according to a SOI-based CMOS process. In such an embodiment, modulator 130 and ring resonator 120 may be a depletion-mode microring modulator.

In one embodiment, heater 140 may be a thin film heater, such as a titanium heater, formed above or adjacent to the modulator structure (for example, formed over at least a portion of the modulator structure, as shown in FIG. 1A). In other non-limiting embodiments, heater 140 may be provided using another heater type and/or geometry, such as doped heaters in silicon, and thin film heaters on top of the cladding.

Furthermore, in silicon-based implementations, photodiode 135, positioned on drop port 125 of the microring modulator 120, may be a defect-enhanced silicon photodiode [5]. Such devices have been demonstrated as effective high-speed optical receivers [6], but an additional utility lies in their use as in-situ power monitors for silicon photonic devices [7]. With their low photoabsorption, they can serve as effective in-waveguide monitors of the optical signal being generated by the microring modulator.

It will be understood that the examples provided herein, which relate to the use of a silicon photodiodes such as a defect-enhanced silicon photodiode, are provided merely as examples, and that other types of photodiodes and optical detectors may be employed for the local measurement of optical power. For example, in one alternative embodiment, the photodiode may be a germanium photodiode, such as a germanium detector integrated with a SOI substrate, e.g. via selective epitaxial growth of germanium on silicon. Other non-limiting examples of alternative detectors include those based on compound semiconductors (such as InGaAs); particularly those which are compatible with integration with silicon waveguides. One example of an alternative detector is the integration of a hybrid III-V detector, such as AlGaInAs quantum wells bonded to a silicon waveguide, as described in [Park et al., Opt. Exp. 15 (10), 6044 (2007)]. Examples of other types of photodetectors include MSM photodetectors, Schottky barrier photodiodes, and photoresistors.

Figure 1B:
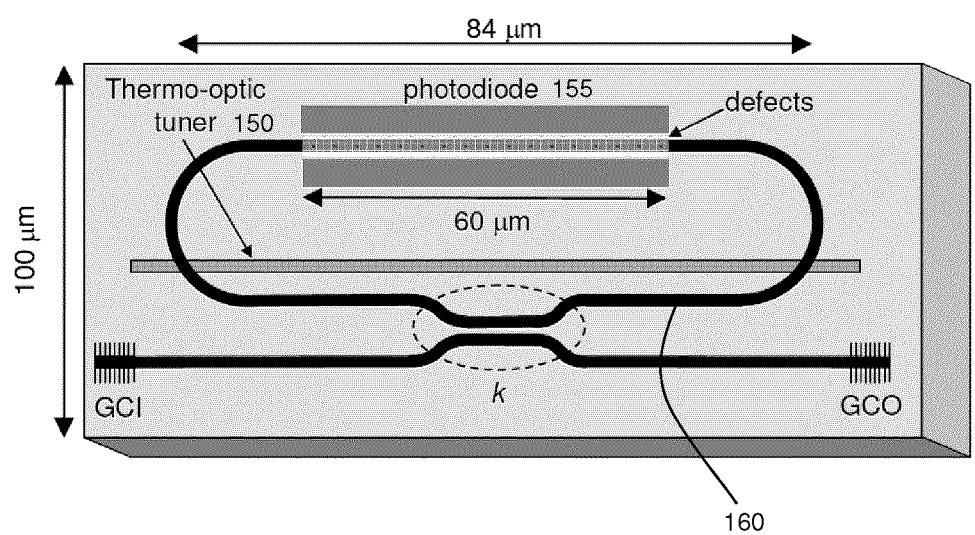
FIG. 1B illustrates an alternative example implementation in which the photodiode is integrated into the microring resonator waveguide itself.

In an alternative embodiment, the thermally stabilized microring configuration described above may be modified such that the integrated photodiode resides within the microring resonator itself, as opposed to being present on a drop port. Accordingly, a drop port is not necessary in such an alternative embodiment. An example of a suitable detector is a defect-enhanced silicon photodiode, as described in [Doylend, J. K., et al., Opt. Exp. 18 (14), 14671 (2010)]. An example of an embodiment employing such a configuration is shown in FIG. 1B, which shows the integration of defect-enhanced silicon photodiode within microring resonator 160, where thermo-optic tuner 150 is employed to stabilize microring resonator 160 with respect to thermal fluctuations via control system.

Figure 1C:
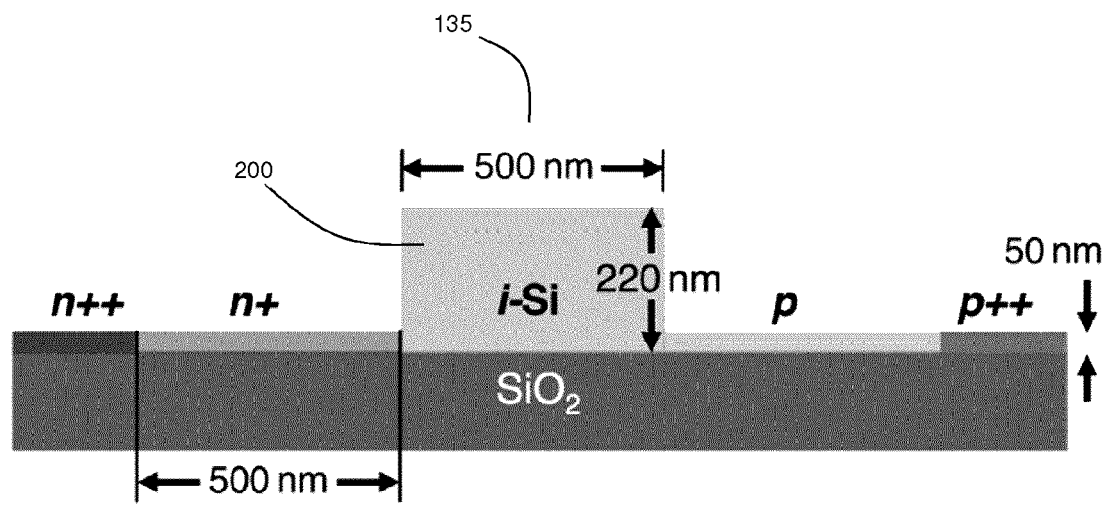
FIGS. 1C and 1D show (C) an example doping profile for the silicon photodiode, and (DC) an example doping profile for the depletion-mode microring modulator, and example circuitry comprising the feedback system.

Referring now to FIGS. 1CB and 1D, an example implementation of a silicon-based device configuration is provided. In the present non-limiting example implementation, the microring is 15 μm in radius, and has a 210 nm point-coupling gap to the input and drop-port waveguide. Holographic gratings of 70-nm etch depth are employed to facilitate coupling of C-band wavelengths into and out of the chip. The cross-section of the photodiode and modulator are shown in FIGS. 1CB and 1CC, respectively. The waveguides 200 are 500 nm wide and 220 nm in height, and etched to a depth of 170 nm.

Referring to FIG. 1CB, photodiode 135 is 500 μm long, and consists of a p-i-n$^+$ junction formed laterally on the waveguide. The p and n$^+$ doping levels of the modulator are in this case aligned to the edge of the waveguide, leaving the core undoped. Sensitivity to sub-bandgap wavelengths was provided by deep level lattice defects introduced by a masked phosphorus implantation of 300 keV and $1\times10^{13}$ cm$^{-2}$ dose followed by a 10 min anneal at 475° C. in a N$_2$ ambient. The damage implantation and anneal was performed directly prior to the metal heater deposition in the process flow.

Figure 1D:
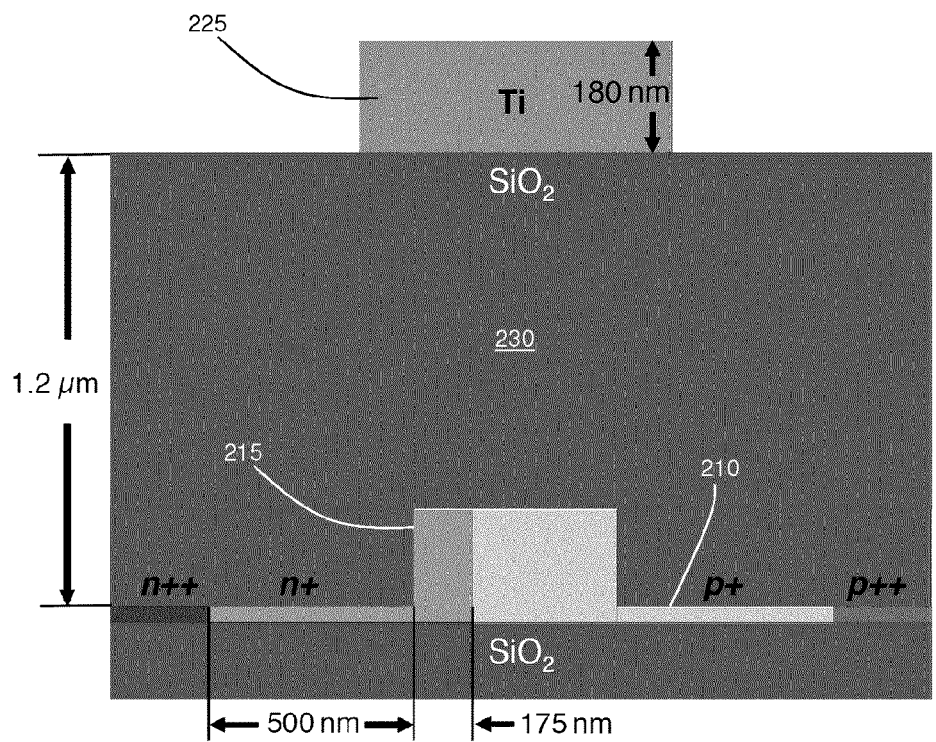

The example modulator shown in FIG. 1DC is formed of an n$^+$p junction that takes up one-half of the ring circumference. The p-side of the junction 210 is composed of a uniform boron concentration of $5\times10^{17}$ cm$^{-3}$ and the n$^+$-side 215 of the junction is composed of a uniform phosphorus concentration of $1\times10^{18}$ cm$^{-3}$. The junction is offset by 75 nm from the center of the waveguide. The thin film heater 225 is patterned on a 180-nm thick titanium-based layer separated from the active layer by 1.2 μm of oxide 230.

Figure 2:
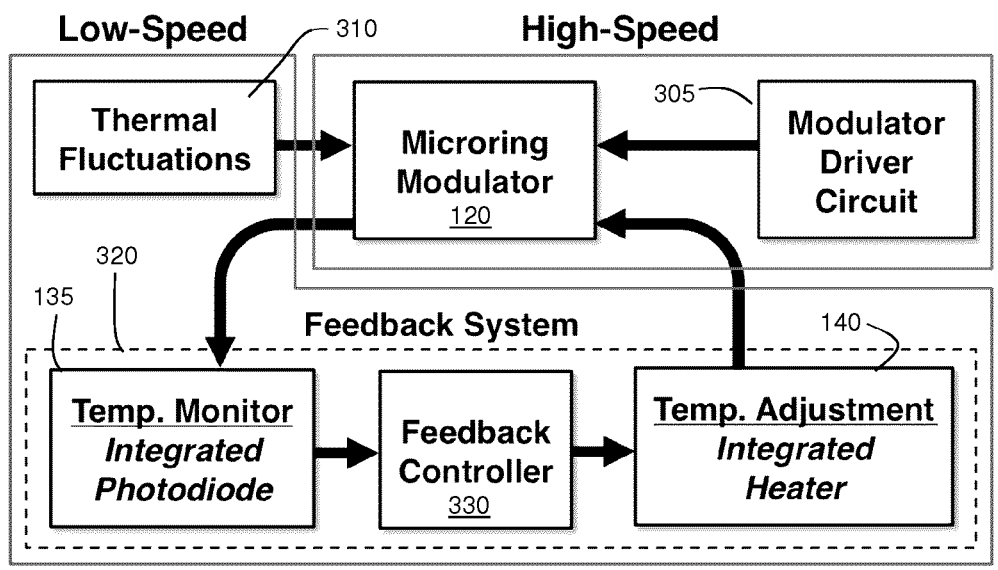
FIG. 2 shows a block diagram of an example microring modulator, including high-speed components for driving the modulator, and low-speed electronics to stabilize the microring resonator under thermal fluctuations.

FIG. 2 is a block diagram illustrating the interrelationship between the microring resonator, the high-speed electronics of the modulator, and the low-speed electronics of the thermal feedback system, showing how the integrated components work in conjunction to thermally stabilize the microring modulator. A high-speed modulator driver circuit 305 drives microring modulator 120 with the data stream. Typically, the microring modulator 120 is driven by a high-performance high-speed driver circuit to generate Gb/s optical data.

On a much slower scale, thermal fluctuations 310 in the environment will cause the temperature of the microring modulator 120 to change, negatively impacting the performance of the microring modulator. The microring modulator is thermally stabilized in the presence of these thermal fluctuations by feedback system 320, which includes integrated photodiode 135, feedback controller 330, and integrated heater 140. The effect of the thermal fluctuations is indirectly measured by integrated photodiode 135, which measures the average optical power at the drop port. Feedback controller 330 processes the average optical power to determine an appropriate voltage to apply to integrated heater 140 in order to stabilize the resonant wavelength of the microring resonator.

Figure 3A:
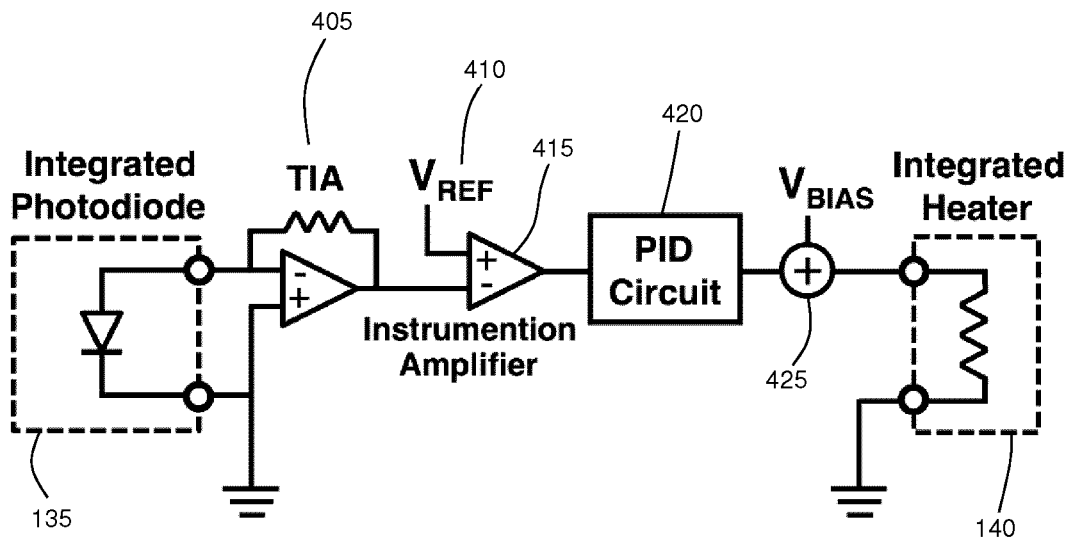
FIG. 3A is an example feedback circuit used for measuring average power from the photodiode and controlling the on-chip heater. Indicated in the dashed boxes are the on-chip integrated components.

FIG. 3A illustrates an example embodiment of the control circuitry, including the interface between the circuitry and the on-chip integrated photodiode 135 and heater 140. As previously mentioned, silicon photodiode 135 is used to ascertain changes in the mean power of the modulated optical signal. The photodiode current is fed into an op-amp transimpedance-amplifier (TIA) circuit 405 that produces a voltage corresponding to the amount of optical power received by the silicon photodiode. The transimpedance voltage generated from this arrangement is then compared to a reference voltage 410 using an instrumentation amplifier 415. The resultant error signal is fed into an analog proportional-integral-derivative (PID) control circuit. The PID circuit generates a feedback signal that is used to adjust the voltage on the integrated heater 140. The bias voltage, $V_{BIAS}$ (425) is employed to set the microring modulator's operating point to an initial wavelength, as described below. Through the feedback mechanism, the integrated heater dynamically reduces current (cools down) in the presence of high ambient temperatures and increases current (heats up) in the presence of low ambient temperatures, thereby maintaining the temperature of the microring modulator at a set operating temperature throughout the duration of the thermal fluctuations inflicted by the visible laser.

Figure 4A:
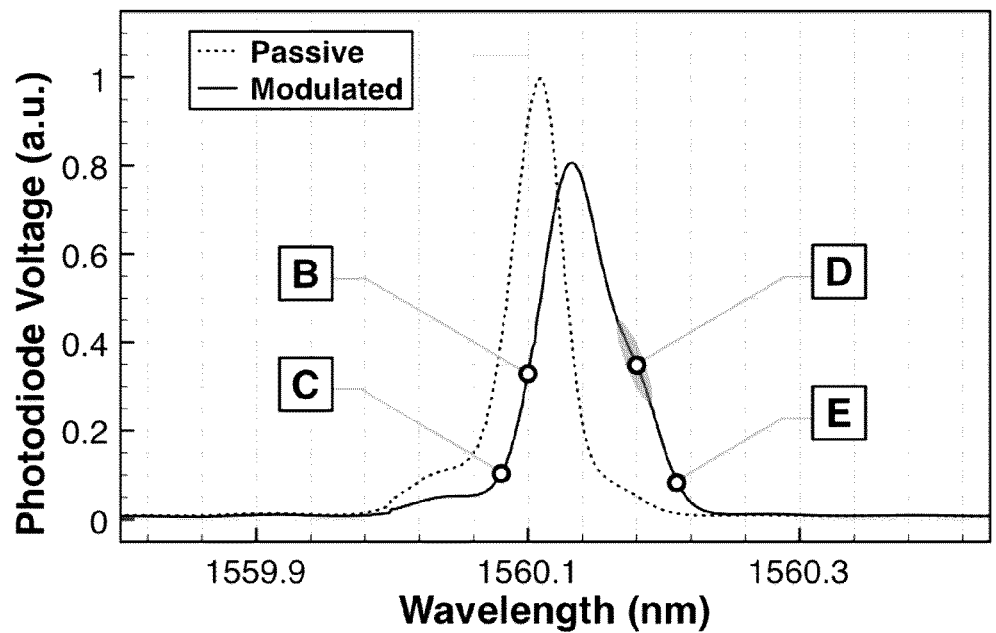
FIG. 4A shows measured photoresponse of the drop-port photodiode of an example microring modulator when the microring is in its passive state, as well as for when it is modulated.
Figure 4B:
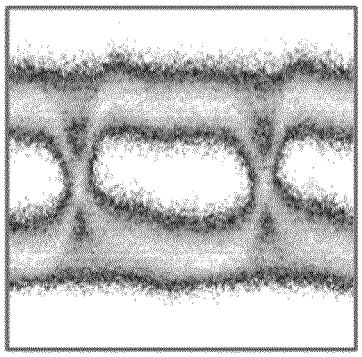
FIGS. 4B-E plot generated 5-Gb/s eye diagrams as indicated at several points on the measured photoresponse of the modulated microring.

FIG. 4A shows example measurements of the voltage generated a drop-port photodiode for a device fabricated according to the configuration shown in FIGS. 1A-C. The data in this Figure was obtained by scanning the wavelength of a tunable laser and measuring the photodiode voltage at each wavelength. When the microring is in its electrically passive state, the drop-port photodiode generates the expected photoresponse, mirroring the Lorentzian lineshape of the microring's optical resonance. When the microring is modulated, the photodiode generates a photocurrent equivalent to the average power between the '1' and '0' modulation states [4]. The resulting broadened response can be seen in FIG. 4A. Additionally, the generated 5-Gb/s eye diagrams for several wavelength points are indicated in FIGS. 4B-4E.

Figure 4D:
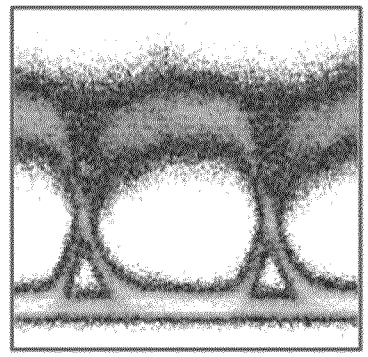
Figure 4C:
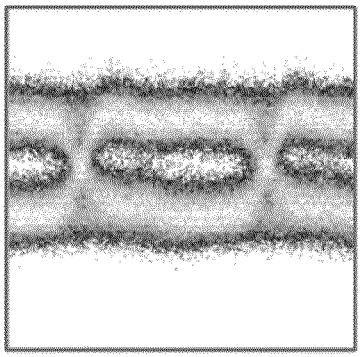
Figure 4E:
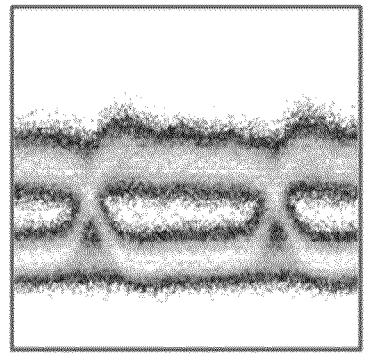

Highlighted in red on the photoresponse curve of FIG. 4A is a region that produces optimally modulated data (FIG. 4D). This region of monotonic slope is used to ascertain changes in temperature. Referring again to FIG. 3A, the reference voltage $V_{REF}$ is set in this region. The difference between the reference voltage and the photodiode voltage, $V_{photodiode} - V_{reference}$, results in an error signal corresponding to increases or decreases in temperature.

Figure 3B:
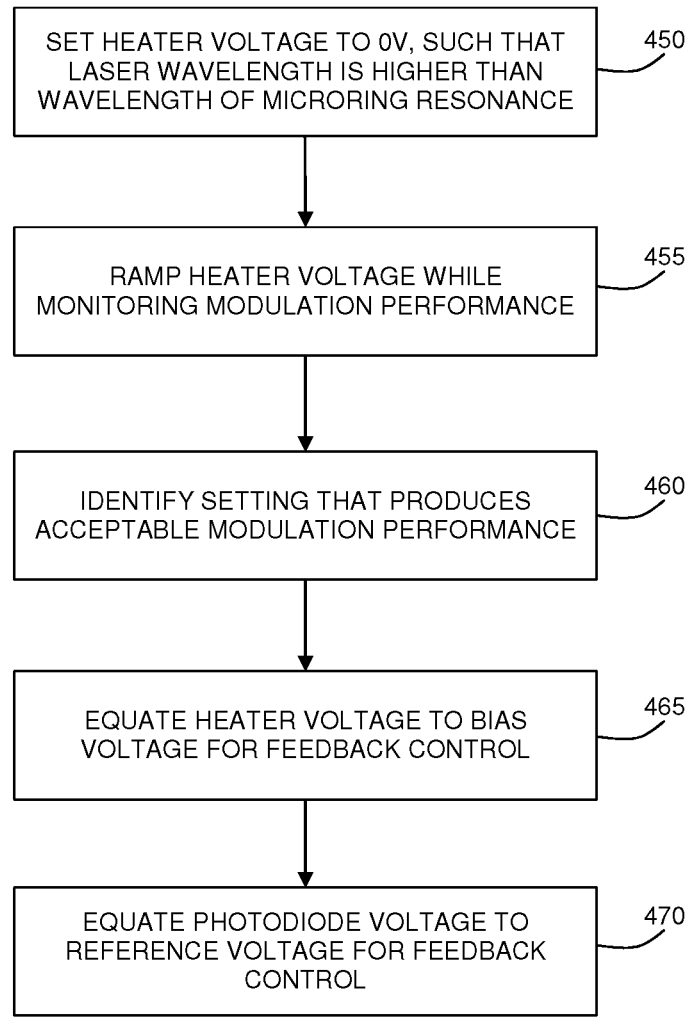
FIG. 3B is a flow chart illustrating an example method of setting the reference voltage and bias voltage of the control circuit.

In one example implementation, the reference voltage $V_{REF}$ and the bias voltage $V_{BIAS}$ may be set as illustrated in the flow chart provided in FIG. 3B. As shown at 450, the voltage of the integrated heater is initially set at 0 V, and the wavelength of the laser is at a higher wavelength than the microring resonance. The voltage of the integrated heater is then ramped with the device in a controlled thermal environment while monitoring the modulation performance, as shown at 455. This may performed by using a test pattern and corresponding circuitry at the receiver, for example, involving the measurement of BER, or for example, involving the measurement of parameters associated with an eye diagram, where an acceptable modulation is deemed to have been obtained once one or more parameters have exceeded a corresponding pre-selected threshold. The voltage is ramped to a setting at which the microring modulator produces acceptable on-off-keyed modulation, as shown at 460. The heater voltage corresponding to this setting is set as the bias voltage, $V_{BIAS}$, as shown at 465. The photodiode voltage corresponding to this setting (as measured at the input to the instrumentation amplifier) is set as the reference voltage, $V_{REF}$, as shown at 470.

Once the temperature change has been inferred by the control circuit interfaced with the integrated photodiode, the controller can then maintain the temperature of the microring modulator by increasing or decreasing its thermal output in response to a decrease or increase of the ambient temperature, respectively. The feedback controller interfacing the two components maintains closed-looped operation of the system. Using this control system, the local temperature of the microring modulator is held constant, and its high-speed performance continues uninterrupted.

It will be understood that the control circuit illustrated in FIG. 3A is provided merely as an example implementation of a control circuit, and that other control circuits may alternatively be employed for controlling the voltage applied to the integrated heater in response to the measured photodiode signal. For example, the feedback circuitry shown in FIG. 3A, involves the following: TIA (1 op-amp), Instrumentation Amplifier, PID controller (4 op-amps), summer (1 op-amp). In one example implementation, this configuration can be simplified to the following components: TIA (1 op-amp), Instrumentation Amplifier (3 op-amps), PID controller (1 op-amp), summer (1 op-amp).

In some embodiments, one or more components of the control circuit are provided off-chip. In such instances, the control circuit could be composed of discrete circuit elements, or alternatively an integrated microelectronic chip. This integrated microelectronic chip may be co-packaged to the photonic chip through a variety of means, including, but not limited to, wire-bonding, and flip-chip connections. In some embodiments, the high-speed electronics for driving the modulator, and/or the low speed electronics for stabilizing the temperature of microring modulator 120 (by controlling heater 140 according to the average optical power measured by photodiode 135), may also be monolithically integrated on-chip (for example, via CMOS processing).

As highlighted in FIG. 2, an important aspect of this integrated system is the independent operation of the low-speed thermal stabilization from the high-speed optical modulation. The control system operates on the same temporal scale as the generation of thermal fluctuations. An important consequence of this is that the control system can be composed of low-speed, and subsequently, energy-efficient electronics that are separate from the high-performance electronics driving the microring modulator. For example, the slow-speed (bandwidth <20 MHz) analog electronics (op-amps and instrumentation amplifier) employed for the feedback system have the potential to be implemented in a low-energy integrated form with the integrated photonics components, providing a small-footprint, energy-efficient, WDM scalable, thermally stable microring modulator for use in next-generation optical links.

In one embodiment in which the device is fabricated via a silicon-based process, defect-enhanced photodetectors are provided on both the through and drop ports of the microring modulator. In such an embodiment, the feedback system is configured to measure the average optical power on both ports, and to providing a relative reference against the optical power reaching the microring modulator. In this instance, the error signal may be calculated as $V_{photodiode\_drop\_port} - V_{reference\_drop\_port} - P*(V_{photodiode\_through\_port} - V_{reference\_through\_port})$, where P is a constant relating the optical power received at the drop port photodiode versus the through port photodiode, and $V_{reference\_drop\_port}$ and $V_{reference\_through\_port}$ are also constants set at the time of the system initialization. This would give the feedback system immunity against changes in the amount of optical power reaching the modulator, which are primarily due to changes in the coupling loss or fluctuations in the laser power.

In order for the thermal stabilization devices and methods described herein to be employed in certain commercial applications, it may necessary to adhere to stringent power consumption requirements foreshadowed for future small-scale optical interconnects. For example, in the most demanding environments, the justification for optical networks-on-chip may require the aggregate power consumption for the optical link to be below ~1 pJ/bit [1]. Less localized interconnects, such as the ones that will populate board-to-board or rack-to-rack interconnections will likely be less strict. The power consumption of various example configurations of the present embodiments is henceforth investigated to determine its compatibility if implemented with current leading technology.

Figures 5A, 5B:
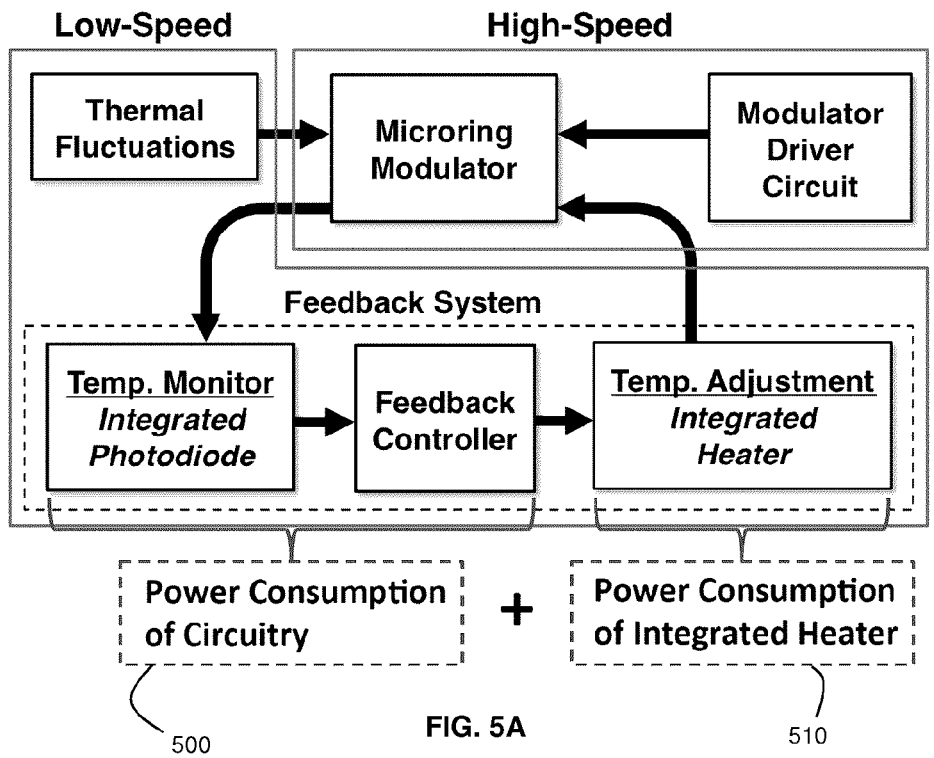
FIG. 5A shows the example block diagram of FIG. 1B, identifying the dominant sources of heat in the system.
FIG. 5B is a table detailing the power consumption of required to thermally stabilize the microring modulator as experimentally implemented, and forecasted for an implementation using current leading technology.

As shown in FIG. 5A, the thermal stabilization system is composed of sub-components, the first sub-component consisting of circuitry 500 to extract the photodiode current and condition the feedback response, the second sub-component consisting of the resistive heater 510 used to adjust the local temperature of the microring modulator.

The following thermal parameters were determined for the example device that was fabricated as described above. For the integrated heater used in the device, a DC resistance of 1340Ω was measured, and a tuning efficiency of 0.12 nm/mW (67 uW/GHz) was determined (see FIG. 5B). This integrated heater was not optimized for tuning efficiency, and hence, has a relatively low tuning efficiency when compared to more recent literature. For this reason, in the present analysis, the results of [10] are utilized, in which an integrated heater was demonstrated to tune across 5 nm (64 K), using sub 1-V voltage, a tuning efficiency of 1.14 nm/mW (7 uW/GHz), and without compromising the performance of the 10-Gb/s microring modulator.

For analyzing the power consumption of the circuitry, one may refer to FIG. 3A, where it is illustrated how the circuitry is composed of a TIA, instrumentation amplifier, PID control circuit, and summer. Aside from the instrumentation amplifier, all of these components were implemented using standard op-amps. However, the instrumentation amplifier is internally composed of 3 op-amps, and can be deconstructed into such. While individual op-amps were used for the proportional, derivative, and integral portions of the PID control, the entire PID control can be, and is routinely implemented, as a single op-amp circuit [11]. Hence, the circuit can be reduced to a total of 6 op-amps.

Simulations on deeply integrated silicon photonic components have shown thermal time constants on the order of ~1 ms [12]. The inventors have shown previously that a feedback controller implemented in analog electronics, comprised of op-amps of 3-MHz bandwidth, could stabilize against thermal fluctuations >1 kHz [4]. Hence, it is concluded that op-amps used in an integrated microelectronic implementation of the system would need to have a bandwidth on the order of 1 MHz, while being able to supply the 1 V required to maximally tune the aforementioned integrated heater [10]. Fortunately, op-amps with these characteristics have been routinely implemented in CMOS technology, with power consumptions as low as 40 uW [13]. This yields an aggregate power consumption of 24 fJ/bit of the circuit at a microring modulation speed of 10 Gb/s.

Figure 6A:
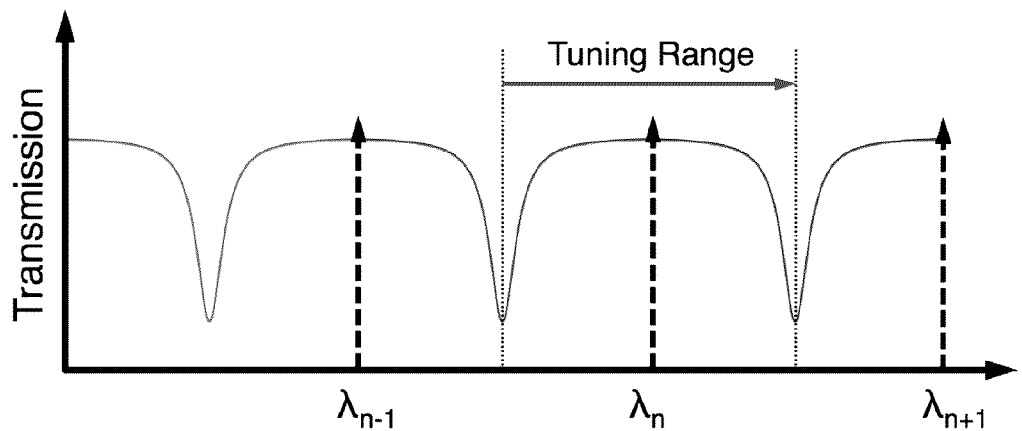
FIG. 6A plots the spectral response of an array of microring resonators and a comb laser source with equivalent spacing. Ambient temperature changes will create relative offsets between the two grids, but this can be corrected by tuning the microring to the laser, with the maximum tuning range equivalent to the channel spacing (the microring-wavelength arrangement will be reshuffled if the microring needs to tune past this point).

In some embodiments, the device may be configured to minimize or reduce the maximum tuning range of any single microring modulator. Specifically, if the temperature change is large enough to shift the microrings more than one channel spacing of their original position, the microring-wavelength assignments can be reshuffled to minimize tuning [17]. Hence, as depicted in FIG. 6A, the maximum tuning range required for a single microring modulator will be equivalent to the channel spacing. In the outlined system, the power consumption for thermally stabilizing a single modulator will be, on average, $P_{Total}=P_{Circuit}+0.5*\text{MaX}\{P_{Heater}\}$, where $P_{Circuit}$ is relatively static, and $\text{Max}\{P_{Heater}\}$ is the maximum required power expended by the heater. Utilizing the previous metrics and analysis, FIG. 7B plots the average power consumption of the thermal stabilization system as a function of channel spacing (top axis), or equivalently, the maximum temperature tuning range required for that channel spacing (bottom axis).

Figure 6B:
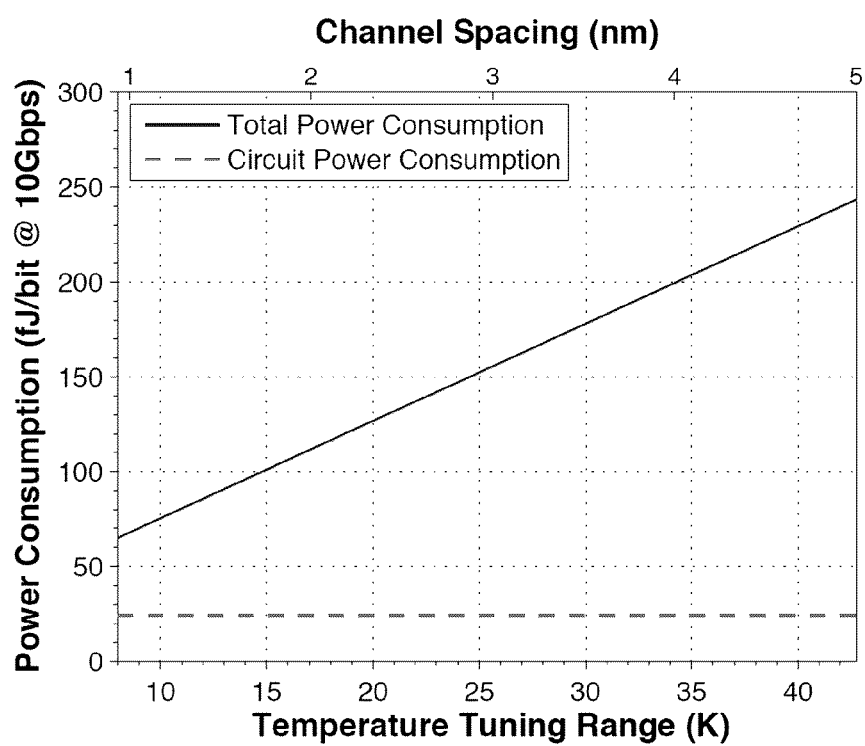
FIG. 6B is a plot of the estimated average power consumption for thermally stabilizing a single microring modulator according to one example implementation. For larger channel spacings (top axis), the microring modulator may have to be tuned across a larger temperature range (bottom axis).
Figure 7:
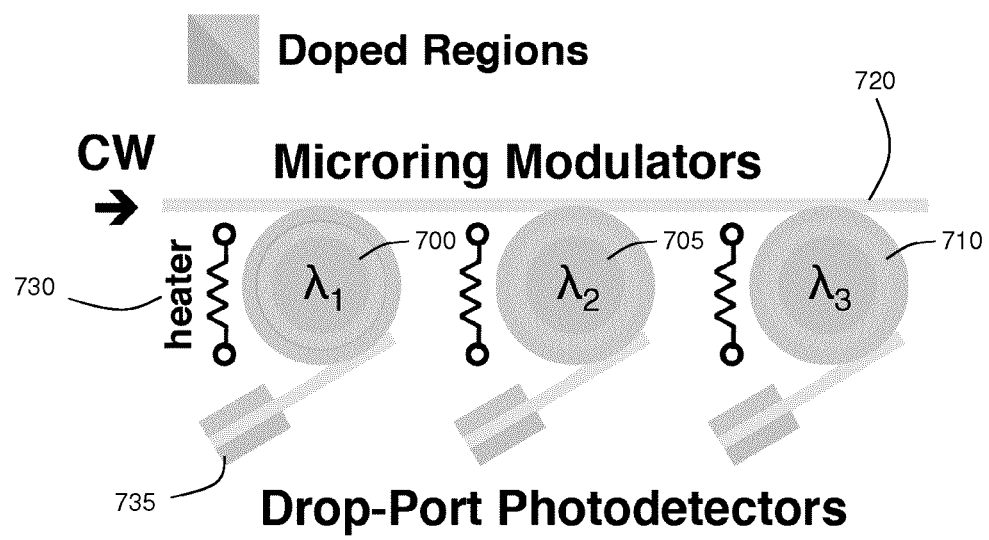
FIG. 7 is a schematic of an example WDM device employing multiple thermally stabilized microring resonators.

The plot in FIG. 6B shows that the integrated heater comprises the large bulk of the power consumption, especially when it is required to cover a large tuning range. While [10] is a leading demonstration of heater efficiency for microring modulators, there may be ways to extend the efficiency of integrated heaters further, such as using undercut structures, for which tuning efficiencies of 2.7 nm/mW (3 μW/GHz) have been demonstrated for passive microring resonators [18]. Improvements in the tuning efficiency of integrated heaters would drastically reduce the power consumption of the thermal stabilization system. Although the examples provided herein relate to devices with a single microring, it is to be understood that the devices and methods described herein may be adapted to provide multi-ring devices that are each thermally controlled. For example, optical interconnects may utilize multiple thermally controlled microrings in a WDM configuration, cascaded along the same waveguide bus [14]. In one example implementation, the source for this type of system will likely be a comb laser containing evenly spaced channels [15]. Additionally, advances in process technology have demonstrated evenly channel-spaced microrings within localized regions [16]. Hence, it is possible to fabricate a system in which there is a rigidly channel-spaced laser source, a rigidly & equivalently channel-spaced array of microring modulators, and a slight offset between the two WDM grids from ambient temperature changes, where the microrings are thermally stabilized according as described herein. An example of such a system is shown in FIG. 7, which illustrates an embodiment in which three microring modulators 700, 705 and 710 are serially interfaced along a bus waveguide 720, and where each microring modulator has a dedicated heater 730 and photodiode 735 (and an associated control circuit, which may or may not be integrated directly with the device, as described above).

Although the preceding example embodiments have related to microring modulators, it is to be understood that microring modulators are but one example of microring resonant devices that can be thermally stabilized. It will be understood that the thermal stabilization methods and devices described herein may be adapted to a wide variety of microring-based resonant devices. Non-limiting examples of other active microring-based resonant devices that may be thermally stabilized according to the embodiments provided herein (or variations of adaptations thereof), include microring lasers, microring sensors, microring switches, amplifiers, attenuators, dispersion compensators, and delay lines. Non-limiting examples of passive microring-based resonant devices that may be thermally stabilized according to the embodiments provided herein (or variations of adaptations thereof), include microring filters, add-drops, cross-connects, mirrors, interleavers, attenuators, dispersion compensators, and delay lines.

The present embodiments, and variations thereof as described above, may be useful in a wide range of applications, including, for example, optical networking, metrology, diagnostics, and therapeutics. Non-limiting examples of networking applications include data-center links, rack-to-rack communication, board-to-board communication, and photonic networks-on-chip.

The following examples are presented to enable those skilled in the art to understand and to practice embodiments of the present disclosure. They should not be considered as a limitation on the scope of the disclosure, but merely as being illustrative and representative thereof.

EXAMPLES

The present example illustrates the operation of a thermally-tuned microring modulator based on active feedback from an integrated photodiode terminating a drop port of the microring resonator.

Figure 8:
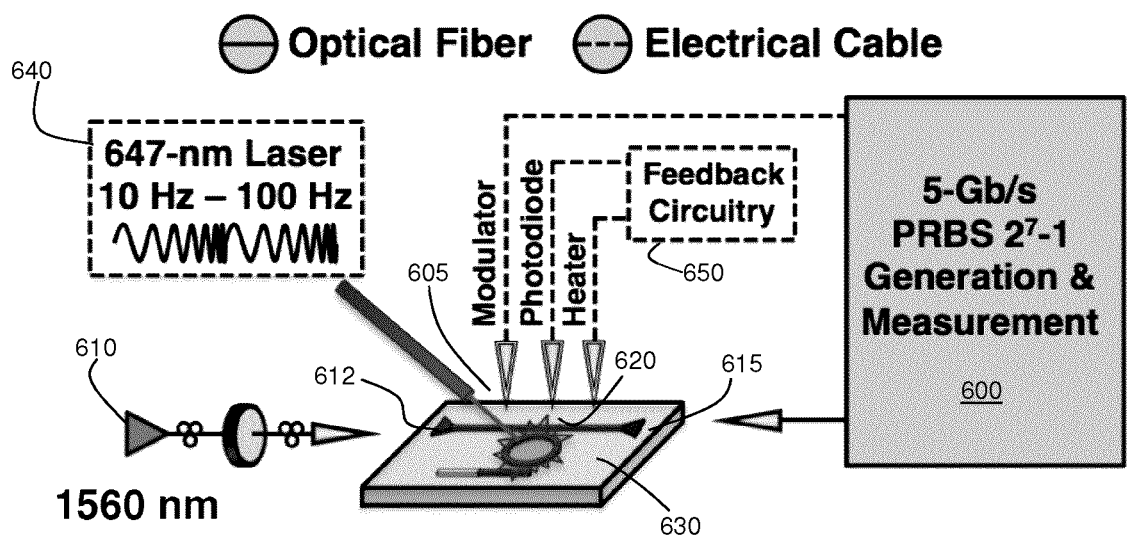
FIG. 8 is a diagram of an experimental apparatus employed to demonstrate thermal stabilization of a microring resonator according to one embodiment of the present disclosure. A 647-nm visible laser is used to simulate thermal fluctuations.

A schematic of the experimental setup is shown in FIG. 8, and the modulator was fabricated as described in FIG. 1A;C-D. A pulsed-pattern-generator was used to generate a 5 Gb/s non-return-to-zero (NRZ) 231-1 pseudo-random-bitsequence (PRBS) electrical signal. This electrical signal was amplified to 5 Vpp and biased at −2.5 V to drive the microring modulator using high-speed electrical probes. A CW tunable laser 610 was set to TE polarization before being launched into the input grating coupler 3612 with a power of 4 dBm. The microring-modulated 5 Gb/s optical signal was recovered from the exit grating coupler 615 at for bit-error-rate (BER) measurements and eye diagrams.

A visible laser 640 at a wavelength of 647 nm was vertically aligned above the microring modulator and was employed for generating thermal variations within the modulator. The power of the visible laser was internally modulated with a 10-100 Hz sinusoid, thereby imprinting a 1-10 Hz sinusoidal thermal fluctuation of magnitude 3K in the localized region of the microring modulator. While the magnitude of the thermal fluctuation was relatively minor, the results provided herein demonstrate that this was a sufficient thermal fluctuation to render the microring modulator inoperable, hence providing a sufficiently thermally volatile environment to demonstrate the functionality of the integrated feedback system.

A separate set of low-speed electrical probes 620 was used to contact the heater and silicon photodiode on the device substrate 630, and these electrodes were connected to feedback circuitry 650 for controlling the heater. As FIG. 8 shows, the operation of the feedback system occurs independent of the high-speed operation of the microring-modulator.

The electrical circuit employed for providing feedback based on the photodiode signal and controlling the heater output was similar to that shown in FIG. 3A. In the experimental configuration used in this example, the feedback circuitry was provided off-chip, and was interfaced with the on-chip integrated photodiode and heater.

Figure 9A:
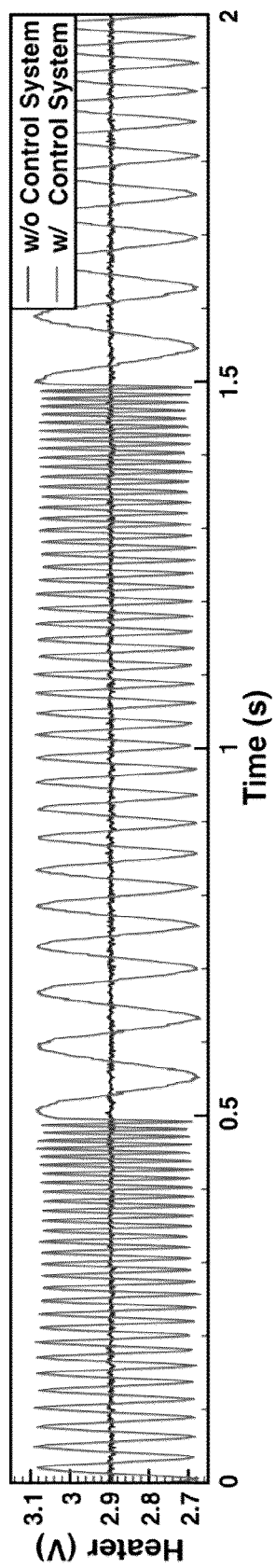
FIGS. 9A and 9B show oscilloscope measurements (with and without the feedback system) of the (A) voltage applied to the heater, and the (B) voltage generated from the photodiode (following the transimpedance amplifier) measuring the mean modulation power.
Figure 9B:
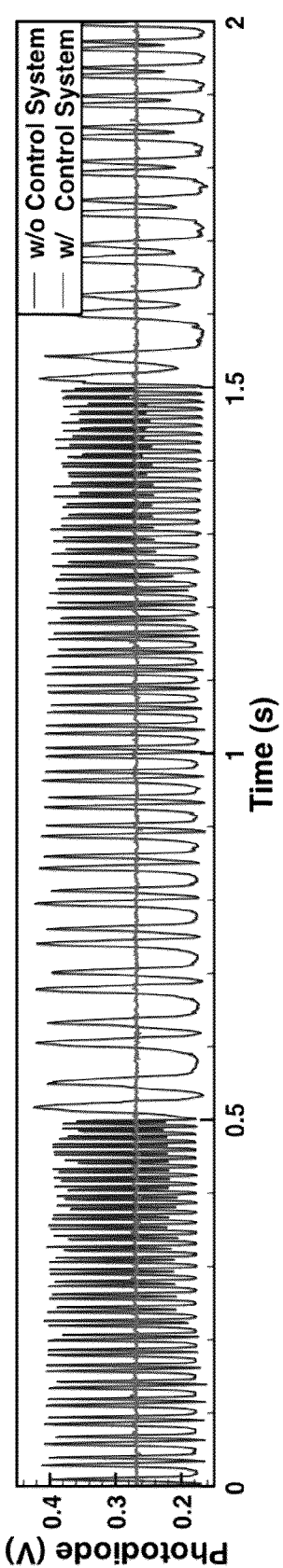

The dynamic adjustment of the heater voltage is seen in the oscilloscope trace of FIG. 9A. Without the feedback circuit, the heater voltage is set at a constant 2.6 V (an arbitrary voltage), whereas, with the feedback circuit, the voltage is swung dynamically between 2.5 V and 2.8 V to correct for the thermal fluctuations. The effect of this action can be seen in the transimpedance voltage from the photodiode (FIG. 9B), which was used to measure the mean modulation power for the feedback system. Without the feedback circuit, the mean modulation power fluctuates in correspondence with the thermal fluctuations. The feedback system locks the mean modulation power to the set reference, ensuring that the modulation is maintained throughout the duration of the thermal fluctuations.

The resonance tuning efficiency of the integrated heater was measured to be 0.12 nm/mW. Utilizing a calculation of the group index of the waveguide, the thermal sensitivity of the resonance is 0.072 nm/K (8.9 GHz/K) [9]. From measuring the minimum and maximum voltage needed to thermally stabilize the microring modulator (FIG. 9A), the magnitude of the temperature fluctuation is inferred to be 3 K. This was the maximum temperature fluctuation that could be generated using the visible laser. While this modest temperature fluctuation is enough to demonstrate the functionality of the stabilization system, it does not represent the full temperature range that the system would be able to correct for. The actual limit on the temperature range of the system is the tuning range is the integrated heater, which was able to routinely tune upwards of 50 K.

Figure 10A:
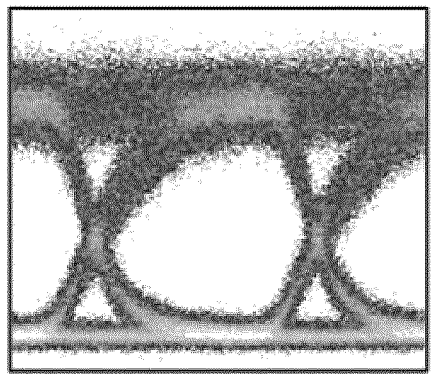
FIGS. 10A-D show eye diagrams of 5 Gb/s microring-modulated optical signal, (A) measured without feedback in a stable thermal environment, (B) measured without feedback under thermal fluctuations, (C) measured with feedback in a stable thermal environment, and (D) measured with feedback under thermal fluctuations.
Figure 10C:
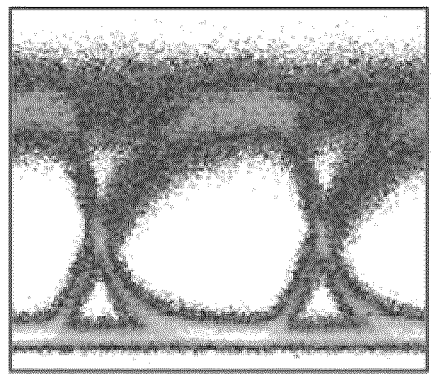
Figure 10B:
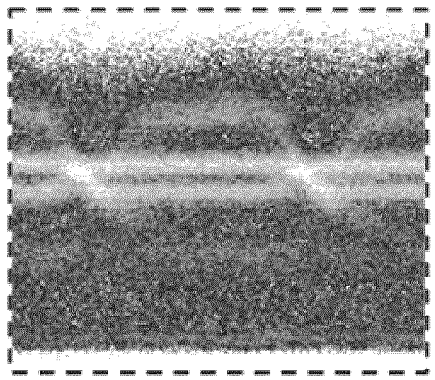
Figure 10D:
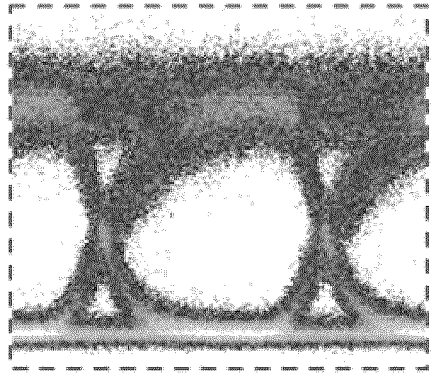
Figure 10E:
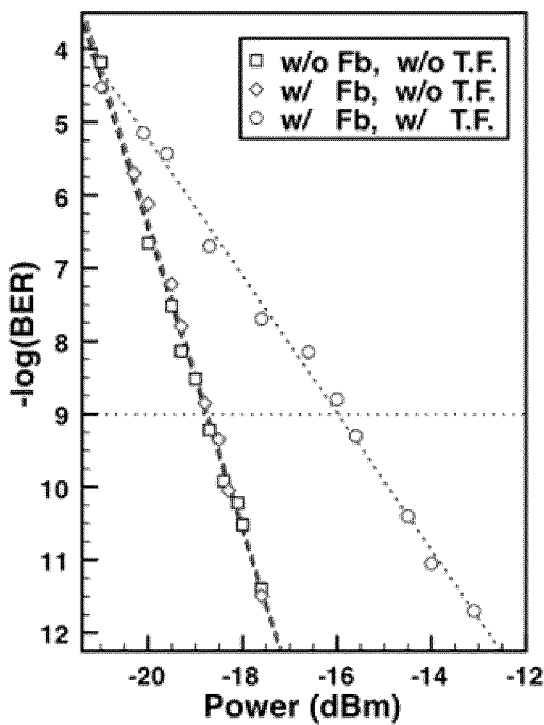
FIG. 10E plots BER measurements corresponding to eye diagrams in (A), (C), and (D).

The eye diagrams and BER measurements in FIGS. 10A-E validate the performance of the feedback system. Without the thermal fluctuations, there is a negligible difference between operating the microring modulator without feedback (FIG. 10A), and with feedback (FIG. 10C), further confirmed by the BER measurements in FIG. 10E, which shows no incurred power penalty as a consequence of operating with the feedback system. As seen in FIG. 10B, subjection of the microring modulator to thermal fluctuations without a corrective feedback system will result in complete failure of the modulation. However, as can be seen in FIG. 10D, the feedback system can correct for the thermal disturbances, maintaining substantially error-free modulation with a power penalty of 2.8 dB (in comparison to the back-to-back case of FIG. 10A).

The 2-dB power penalty is attributable to mode-hopping in the visible laser inflicting the thermal fluctuations. The large modulation of current of the visible laser causes it to mode-hop, resulting in small but fast discontinuities in the modulation of its optical power. This results in small but very fast thermal fluctuations appearing in the larger overall thermal fluctuation. The circuitry was designed to counteract thermal fluctuations<1 kHz, implementing low-pass filters to reduce the noise in the unshielded circuitry. As a consequence, it could not contend with these small but fast mode-hopped induced thermal fluctuations, creating the large 2-dB power penalty. If the control system were to be properly implemented in integrated circuitry, it is envisioned that the 2-dB power penalty would be drastically reduced.

In this example, thermal stabilization of a silicon-based microring resonator has been demonstrating using components integrated directly with a microring modulator. The demonstrated feedback system operates independently, and without substantially disturbing, the high-performance optical modulation. While this example illustrates the basic functionality of the system, it has been shown that a heater closely integrated with the modulator can enable energy-efficient thermal tuning across a range of 60 K, lending plausibility to the ability of this system to potentially adapt to the full range of temperatures that would be encountered in a microelectronics environment.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

REFERENCES

1. A. V. Krishnamoorthy, R. Ho, X. Zheng, H. Schwetman, J. Lexau, P. Koka, G. Li, I. Shubin, and J. E. Cunningham, "Computer systems based on silicon photonic interconnects," Proc. IEEE 97(7), 1337-1361 (2009).
2. N. Ophir, D. Mountain, C. Mineo, and K. Bergman, "Silicon photonic microring links for high-bandwidth-density, low-power chip I/O," IEEE Micro 33(1), 54-67 (2013).
3. W. A. Zortman, A. L. Lentine, D. C. Trotter, and M. R. Watts, "Bit error rate monitoring for active wavelength control of silicon microphotonic resonant modulators," IEEE Micro 33(1), 42-52 (2013).
4. K. Padmaraju, J. Chan, L. Chen, M. Lipson, and K. Bergman, "Thermal stabilization of a microring modulator using feedback control," Opt. Express 20(27), 27999-28008 (2012).
5. M. W. Geis, S. J. Spector, M. E. Grein, J. U. Yoon, D. M. Lennon, and T. M. Lyszczarz, "Silicon waveguide infrared photodiodes with >35 GHz bandwidth and phototransistors with 50 AW-1 response," Opt. Express 17(7), 5193-5204 (2009).
6. R. R. Grote, K. Padmaraju, B. Souhan, J. B. Driscoll, K. Bergman, and R. M. Osgood, Jr., "10 Gb/s error-free operation of all-silicon ion-implanted-waveguide photodiodes at 1.55 μm," IEEE Photon. Technol. Lett. 25(1), 67-70 (2013).
7. D. F. Logan, P. Velha, M. Sorel, R. M. De La Rue, P. E. Jessop, and A. P. Knights, "Monitoring and tuning microring properties using defect-enhanced silicon photodiodes at 1550 nm," IEEE Photon. Technol. Lett. 24(4), 261-263 (2012).
8. K. Padmaraju, D. F. Logan, X. Zhu, J. J. Ackert, A. P. Knights, and K. Bergman, "Integrated thermal stabilization of a microring modulator," Proc. Optical Fiber Communication Conference (Optical Society of America, 2013), paper OM2H.7.
9. J. Teng, P. Dumon, W. Bogaerts, H. Zhang, X. Jian, X. Han, M. Zhao, G. Morthier, and R. Baets, "Athermal silicon-on-insulator ring resonators by overlaying a polymer cladding on narrowed waveguides," Opt. Express 17(17), 14627-14633 (2009).
10. W. A. Zortman, A. L. Lentine, D. C. Trotter, and M. R. Watts, "Integrated CMOS compatible low power 10 Gbps silicon photonic heater-modulator," Proc. Optical Fiber Communication Conference (Optical Society of America, 2012), paper OW41.5.
11. V. Michel, C. Premont, G. Pillonet, and N. Abouchi, "Single active element PID controllers," Radioelektronika, 2010 20th International Conference.
12. Y.-H. Chen, C. Sun, and V. Stojanovic, "Scalable electrical-optical thermal simulator for multicores with optical interconnects," Proc. IEEE Optical Interconnects Conference (IEEE, 2013), paper MA3.
13. C. J. B. Fayomi, M. Sawan, and G. W. Roberts, "Reliable circuit techniques for low-voltage analog design in deep submicron standard CMOS: a tutorial," Analog Integr. Circuits Signal Process. 39(1), 21-38 (2004).
14. D. Brunina, X. Zhu, K. Padmaraju, L. Chen, M. Lipson, and K. Bergman, "10-Gb/s WDM optically-connected memory system using silicon microring modulators," Proc. European Conference on Optical Communications (Optical Society of America, 2012), paper Mo.2.A.5.
15. D. Livshits, D. Yin, A. Gubenko, I. Krestnikov, S. Mikhrin, A. Kovsh, and G. Wojcik, "Cost-effective WDM optical interconnects enabled by quantum dot comb lasers," Proc. Optoelectronic Interconnects and Component Integration IX (SPIE, 2010).
16. A. V. Krishnamoorthy, X. Zheng, G. Li, J. Yao, T. Pinguet, A. Mekis, H. Thacker, I. Shubin, Y. Luo, K. Raj, and J. E. Cunningham, "Exploiting CMOS manufacturing to reduce tuning requirements for resonant optical devices," IEEE Photon. J. 3(3), 567-579 (2011).
17. M. Georgas, J. Leu, B. Moss, C. Sun, and V. Stojanovic, "Addressing link-level design tradeoffs for integrated photonic interconnects," in Custom Integrated Circuits Conference (IEEE, 2011), 978-1-4577-0233-5/11.
18. P. Dong, W. Qian, H. Liang, R. Shafiiha, D. Feng, G. Li, J. E. Cunningham, A. V. Krishnamoorthy, and M. Asghari, "Thermally tunable silicon racetrack resonators with ultralow tuning power," Opt. Express 18(19), 20298-20304 (2010).

Therefore what is claimed is:

1. A thermally stabilized integrated optical device comprising:
a microring resonator modulator configured to modulate an optical signal;
a high-speed modulator circuit for driving said microring resonator modulator at a modulation rate;
a photodetector integrated with said microring resonator modulator;
a heater configured to locally heat said microring resonator modulator; and
a low-speed controller interfaced with said photodetector and said heater, wherein said controller is configured to thermally stabilize a resonant wavelength of said microring resonator modulator by controlling said heater to maintain the average power as measured by said photodetector on a timescale that is longer than a modulation timescale associated with the modulation rate, such that the microring resonator modulator is thermally stabilized independent of the modulation rate thereof.

2. The thermally stabilized integrated optical device according to claim 1 wherein said controller is configured to vary a voltage applied to said heater according to a difference between a voltage measured from said photodetector and a reference voltage.

3. The thermally stabilized integrated optical device according to claim 1 further comprising an additional photodetector integrated with a through port of said microring resonator modulator, wherein said controller is interfaced with said additional photodetector, and wherein said controller is configured to thermally stabilize a resonant wavelength of said microring resonator modulator by controlling said heater in response to average power measured by said photodetector and said additional photodetector.

4. The thermally stabilized integrated optical device according to claim 1 wherein said microring resonator modulator comprises a drop port, and wherein said photodetector is integrated with said drop port.

5. The thermally stabilized integrated optical device according to claim 1 wherein said microring resonator modulator comprises an annular waveguide.

6. The thermally stabilized integrated optical device according to claim 1 wherein said microring resonator modulator comprises a micro-disk resonator.

7. The thermally stabilized integrated optical device according to claim 1 wherein said photodetector is a defect-enhanced silicon photodiode.

8. The thermally stabilized integrated optical device according to claim 1 wherein said heater is a thin film heater.

9. The thermally stabilized integrated optical device according to claim 1 wherein said controller is integrated with said microring resonator modulator on a common substrate.

10. The thermally stabilized integrated optical device according to claim 1 wherein said controller is formed on a separate substrate from that of said microring resonator modulator.

11. The thermally stabilized integrated optical device according to claim 1 wherein said microring resonator modulator is employed as a component of an active device selected from the group consisting of microring lasers, microring sensors, microring switches, amplifiers, attenuators, dispersion compensators, and delay lines.

12. The thermally stabilized integrated optical device according to claim 1 wherein said microring resonator modulator is employed as a component of a passive device selected from the group consisting of microring filters, add-drops, cross-connects, mirrors, interleavers, attenuators, dispersion compensators, and delay lines.

13. The thermally stabilized integrated optical device according to claim 1 further comprising one or more additional thermally stabilized microring resonators modulators arranged serially with respect to a common bus waveguide, wherein each microring resonator modulator has associated therewith a dedicated heater and a dedicated photodetector, and wherein each microring resonator modulator has a different operational wavelength.

14. The thermally stabilized integrated optical device according to claim 2 wherein said controller is further configured to apply a bias voltage to said heater in the absence of a difference between said voltage measured from said photodetector and said reference voltage.

15. The thermally stabilized integrated optical device according to claim 14 wherein said bias voltage and said reference voltage are selected, for a given wavelength, based on the high-speed performance of said microring resonator modulator.

16. The thermally stabilized integrated optical device according to claim 15 wherein said bias voltage and reference voltage are selected, for said given wavelength, such that one or more parameters associated with high-speed performance of said microring resonator modulator exceed a pre-selected threshold.

17. The thermally stabilized integrated optical device according to claim 15 wherein said bias voltage is selected such that thermally induced variations in said voltage measured from said photodetector relative to said reference voltage at said given wavelength occur within a region of monotonic slope.

18. The thermally stabilized integrated optical device according to claim 5 wherein said photodetector is integrated within said annular waveguide of said microring resonator modulator.

19. The thermally stabilized integrated optical device according to claim 10 wherein said substrate associated with said microring resonator modulator and said separate substrate are co-packaged.

20. The thermally stabilized integrated optical device according to claim 19 wherein said substrate associated with said microring resonator modulator and said separate substrate are co-packaged via one of wire-bonding and flip-chip bonding.

21. A method of stabilizing the operation of an integrated optical device, the integrated optical device comprising a microring resonator modulator and a modulator circuit for driving said microring resonator modulator at a modulation rate, the microring resonator modulator having a heater and a photodetector interfaced directly therewith, the method comprising:
measuring, with the photodetector, average power on a timescale that is longer than a modulation timescale associated with the modulation rate; and
controlling the heater to maintain the average power such that the microring resonator modulator is thermally stabilized independent of the modulation rate thereof.

22. The method according to claim 21 wherein the heater is controlled by varying a voltage applied to the heater.

23. The method according to claim 22 wherein the photodetector is a photodetector, the method further comprising varying the voltage according to a difference between a voltage measured from the photodetector and a reference voltage.

24. The method according to claim 23 further comprising applying a bias voltage to the heater in the absence of a difference between the voltage measured from the photodetector and the reference voltage.

25. The method according to claim 24 wherein the bias voltage and the reference voltage are selected, for a given wavelength, based on the high-speed performance of the microring resonator modulator.

26. The method according to claim 25 wherein the bias voltage and the reference voltage are selected by:
ramping a voltage applied to the heater, with the device in a controlled thermal environment, to identify a voltage at which the one or more parameters associated with high-speed performance of the microring resonator modulator exceed the pre-selected threshold;
setting the bias voltage as the voltage applied to the heater; and
setting the reference voltage as the voltage measured by the photodetector.

27. The method according to claim 25 further comprising selecting the bias voltage such that thermally induced variations in the voltage measured from the photodetector relative to the reference voltage at the given wavelength occurs within a region of monotonic slope.

28. The method according to claim 21 wherein the heater is controlled via control circuitry integrated on a common substrate with the microring resonator modulator.

29. The method according to claim 21 wherein the heater is controlled via control circuitry formed on a separate substrate from that of the microring resonator modulator.

* * * * *

UNITED STATES PATENT AND TRADEMARK OFFICE
CERTIFICATE OF CORRECTION

PATENT NO. : 9,831,360 B2
APPLICATION NO. : 14/434081
DATED : November 28, 2017
INVENTOR(S) : Andrew Knights et al.

It is certified that error appears in the above-identified patent and that said Letters Patent is hereby corrected as shown below:

In the Specification

Column 1, Line 17, please insert the following paragraph:
--This invention was made with government support under 0903406 awarded by the National Science Foundation. The government has certain rights in the invention.--

Signed and Sealed this
Nineteenth Day of September, 2023

Katherine Kelly Vidal
*Director of the United States Patent and Trademark Office*